United States Patent [19]
Batra et al.

[11] Patent Number: 6,060,355
[45] Date of Patent: *May 9, 2000

[54] PROCESS FOR IMPROVING ROUGHNESS OF CONDUCTIVE LAYER

[75] Inventors: Shubneesh Batra; Pierre C. Fazan; John K. Zahurak, all of Boise, Id.

[73] Assignee: Micron Technology, Inc., Boise, Id.

[ * ] Notice: This patent is subject to a terminal disclaimer.

[21] Appl. No.: 09/073,380

[22] Filed: May 6, 1998

Related U.S. Application Data

[63] Continuation of application No. 08/749,569, Nov. 15, 1996, Pat. No. 5,770,500.

[51] Int. Cl.[7] .................. H01L 21/8242; H01L 21/8249; H01L 21/20; H01L 27/108
[52] U.S. Cl. .......................... 438/255; 438/238; 438/398; 257/309
[58] Field of Search .................................. 438/238, 255, 438/246; 257/296, 301, 309

[56] References Cited

U.S. PATENT DOCUMENTS

| | | | |
|---|---|---|---|
| 5,112,733 | 5/1992 | Tuttle ........................................ | 438/964 |
| 5,130,885 | 7/1992 | Fazan et al. .............................. | 438/964 |
| 5,245,206 | 9/1993 | Chu et al. ................................. | 257/309 |
| 5,266,514 | 11/1993 | Tuan et al. ............................... | 438/964 |
| 5,366,917 | 11/1994 | Watanabe et al. ........................ | 438/964 |
| 5,385,863 | 1/1995 | Tatsumi et al. ........................... | 438/964 |
| 5,429,972 | 7/1995 | Anjum et al. ............................. | 438/964 |
| 5,516,724 | 5/1996 | Ast et al. .................................. | 438/933 |
| 5,597,756 | 1/1997 | Fazan et al. .............................. | 438/964 |
| 5,639,685 | 6/1997 | Zahurak et al. .......................... | 438/398 |
| 5,658,381 | 8/1997 | Thakur et al. ............................ | 438/964 |
| 5,663,090 | 9/1997 | Fazan et al. .............................. | 438/964 |
| 5,760,434 | 6/1998 | Zahurak et al. .......................... | 257/309 |
| 5,770,500 | 6/1998 | Batra et al. ............................... | 438/255 |

OTHER PUBLICATIONS

King et al. "PMOS Transistors in LPCVD Polycrystalline Silicon–Germanium Films", IEEE Electron Device Letters, vol. 12 No. 11, Nov. 1991, pp. 584–586.

Sakai, A. and Tatsumi, T., "Novel Seeding Method for the Growth of Polycrystalline Si Films with Hemispherical Grains," App. Phys. Lett., vol. 61(2), pp. 159–161, Jul. 1992.

Watanabe, H., Tatsumi, T., Ohnishi, S., Kitajima, H., Honma, I., Ikarashi, T. and Ono, H., "Hemispherical Grained Si Formation on In–Situ Phosphorus Doped Amorphous–Si Electrode for 256Mb DRAM's Capacitor," IEEE Transactions on Electron Devices, vol. 42, No. 7, pp. 1247–1254, Jul. 1995.

Sakai, A., Tatsumi, T. and Ishida, K., "Growth Kinetics of Si Hemispherical Grains on Clean Amorphous–Si Surfaces," Journal of Vacuum Science and Technology, vol. 11, No. 6, pp. 2950–2953, Nov./Dec. 1993.

Watanabe, H., Tatsumi, T., Ikarashi, T., Sakai A. . . , Aoto, N. and Kikkawa, T., "An Advanced Technique for Fabricating Hemisperical–Grained (HSG) Silicon Storage Electrodes," IEEE Transactions on Electron Devices, vol. 42, No. 2, pp. 295–301, Feb. 1995.

Shiryaev et al., "On the nature of cross–hatch patterns on compositionally graded $Si_{(1-x)}$ $Ge_{(x)}$ alloy layers," Applied Physics Letters, 64 (24), pp. 3305–3307, Jun. 1994.

*Primary Examiner*—Matthew Smith
*Assistant Examiner*—Lex Malsawma
*Attorney, Agent, or Firm*—Knobbe, Martens, Olson & Bear, LLP

[57] ABSTRACT

Disclosed is a method of fabricating hemispherical grained (HSG) silicon layers. A surface seeding method is disclosed, wherein an amorphous silicon layer is doped with germanium. The silicon may be doped with germanium during deposition, or a previously formed silicon layer may be implanted with the germanium. The layer may also be in situ conductively doped. The Ge-doped amorphous silicon is then subjected to a vacuum anneal in which surface migration of silicon atoms causes a redistribution in the layer, and hemispherical grains or bumps result. A seeding source gas may flow during the anneal to aid in nucleation. The method permits HSG silicon formation at lower temperature and shorter duration anneals than prior art methods. Greater silicon mobility in the presence of germanium dopants also enables the growth of larger grains, thus enhancing surface area. At the same time, the germanium provides conductivity for memory cell charge storage.

32 Claims, 4 Drawing Sheets

PROCESS FOR IMPROVING ROUGHNESS OF CONDUCTIVE LAYER

This application is a continuation of application Ser. No. 08/749,569, filed Nov. 15, 1996, now U.S. Pat. No. 5,770,500 entitled "PROCESS FOR IMPROVING ROUGHNESS OF CONDUCTIVE LAYER."

FIELD OF THE INVENTION

The present invention relates to capacitor electrodes for integrated circuit memory cells, and more particularly to capacitor electrodes incorporating rugged or rough silicon layers.

BACKGROUND OF THE INVENTION

Recent advances in the miniaturization of integrated circuits have led to smaller wafer areas made available for devices. High density dynamic random access memory chips (DRAMs), for example, leave little room for the storage node of a memory cell. Yet even as the "footprint" (area of a silicon wafer alotted individual memory cells) shrinks, the storage node (capacitor) must maintain a certain minimum charge storage capacity, determined by design and operational parameters, to ensure reliable operation of the memory cell. It is thus increasingly important that capacitors achieve high charge storage per unit area of the wafer. Accordingly, several techniques have been recently developed to increase the total charge capacity of the cell capacitor without significantly affecting the wafer area occupied by the cell.

Traditionally, capacitors integrated into memory cells have been patterned after the parallel plate capacitor. An interelectrode dielectric material is deposited between two conductive layers, which form the capacitor plates or electrodes. The amount of charge stored on the capacitor is proportional to the capacitance, $C=\epsilon\epsilon_0 A/d$, where $\epsilon$ is the dielectric constant of the capacitor dielectric, $\epsilon_0$ is the vacuum permittivity, A is the electrode area, and d represents the spacing between electrodes. Some techniques for increasing capacitance include the use of new materials characterized by high dielectric constants.

Other techniques concentrate on increasing the effective surface area ("A") of the electrodes by creating folding structures such as trench or stacked capacitors. Such structures better utilize the available chip area by creating three dimensional shapes to which the conductive plates and capacitor dielectric conform. For example, U.S. Pat. No. 5,340,765, issued Aug. 23, 1994 to Dennison et al. and assigned to the assignee present invention, discloses a process for forming a capacitor structure resembling a cylindrical container. More complex structures, such as the container-within-container and multiple pin structures disclosed in U.S. Pat. No. 5,340,763, issued Aug. 23, 1994 to Dennison, may further increase electrode surface area and allow the extension of conventional fabrication materials to future generation memory devices.

Electrode surface area may also be increased by providing a rough texture for the electrode surface. One class of methods for providing rough electrode surfaces involves texturizing a conductive layer by formation of hemispherical grained (HSG) silicon.

FIGS. 1 and 2 illustrate the fabrication of a simple container, including an HSG silicon interior surface, in the context of a dynamic random access memory (DRAM) cell, wherein the container dimensions are defined by etching through a BPSG structural layer 22. The container etch exposes a circuit node 10 which, in the illustrated example, comprises a polysilicon plug 10 in electrical contact with an active area 14 of a semiconductor wafer 16. The plug 10 resides between two neighboring words lines 12 of the DRAM array. A conductive layer 25, generally comprising polycrystalline silicon (polysilicon), is then deposited over the structure, thus lining the inside surfaces of the container 24 as well as forming horizontal arms 26 overlying the structural layer 22. A rugged or rough silicon layer 28 is formed over the polysilicon layer 25 to further enhance the surface area of the in-process container electrode.

Referring now to FIG. 2, the horizontal portions 26 of the polysilicon layer 25 have been removed by a planarization step, such as chemical mechanical planarization (CMP), for electrical isolation of the various memory cells in the array. A polysilicon container 30, which is to serve as a bottom electrode for the cell capacitor, is left in contact with the polysilicon plug 10. An inside surface 42 of the container 30 is available for charge storage during circuit operation. For other known process flows, the outside surface may also contribute to capacitane by removal of the structural layer. The cell's capacitor dielectric and top electrode may then be successively deposited. It should be noted that the illustrated DRAM container cell is but one example of capacitor configurations, and that rugged or rough silicon may increase the electrode surface area of most electrode designs.

The rough silicon 28 may be formed by a number of different methods, including gas phase nucleation and surface seeding. An extremely thin layer of oxide, for example, may serve as a substrate layer for rough silicon growth to follow. Native oxide is allowed to grow over an underlying substrate, such as the polysilicon layer 25 shown in FIG. 1. Polysilicon may then be deposited by low pressure chemical vapor deposition (LPCVD), and silicon grains grow preferentially about nucleation sites. Nucleation sites may also be provided by the deposition of dispersed particles as disclosed by U.S. Pat. No. 5,102,823, issued to Tuttle. In either case, during the initial stages of polysilicon deposition, the presence of nucleation sites causes the formation of polysilicon nodules. During later stages of deposition, polysilicon will continue to coat the previously created nodules, resulting in stable, hemispherical polysilicon grains.

More recently, however, rough silicon has been formed by a surface seeding method. A silicon layer, generally comprising amorphous silicon, is deposited over the electrode substrate (e.g., the polysilicon layer 25 shown in FIGS. 1 and 2). The structure is then subjected to a vacuum anneal within critical temperature and pressure ranges. Thermal energy during the anneal brings about a redistribution of silicon atoms in the amorphous silicon layer, resulting in a rough configuration such as hemispherical grains of polysilicon. U.S. Pat. No. 5,407,534, issued to Thakur and assigned to the assignee of the present invention, discloses a particular texturizing vacuum anneal wherein a fluorine-based gas, diluted with an inert gas (e.g., argon), enhances the redistribution.

The layer of amorphous silicon is heated to a temperature in the range of 560° C. and 620° C., but most efficiently at about 600° C., while the chamber pressure is maintained between about $1\times10^{-1}$ Torr and $1\times10^{31\ 3}$ Torr. A fluorine-based gas (e.g., $NF_3$, $CF_4$, or $C_2F_6Cl_2$), diluted with an inert gas (e.g., argon), is bled into the anneal chamber. The amorphous silicon is annealed under these conditions for between 1 minute and 60 minutes. Aside from the incorporation of fluorine-based gas, these parameters are typical of other known vacuum anneal processes for forming rough silicon layers.

A 300 Å layer of amorphous silicon may thus be converted to a layer of rough silicon with grain or "bump height" of about 500 Å. The rough silicon layer 28 forms at least part of surface of the bottom or storage electrode of the memory cell capacitor. Accordingly, in order to provide reasonable conductivity, the rough silicon layer 28 is generally lightly doped with n-type dopants after the anneal step.

Processes of rough silicon fabrication have been shown to result in significantly increased capacitance, which is vital to maintaining the trend toward increasingly dense circuits. At the same time, however, they may increase cost of production considerably. The time required for annealing and post-anneal doping slow down the process as well, reducing throughput. In addition, current methods of fabrication are limited in the "bump height" which can be achieved. Extending the anneal beyond an optimal length of time tends to cause bumps to merge back together.

A need therefore exists to improve the cost and time efficiency of HSG silicon fabrication.

SUMMARY OF THE INVENTION

Disclosed is a process for forming rough silicon layers. The process comprises forming a silicon layer over a surface within an integrated circuit. Germanium is incorporated into the silicon layer. The silicon-germanium layer is annealed to roughen the layer.

For a preferred embodiment, the germanium is incorporated into the layer during silicon deposition. Thus, for example, in a chemical vapor deposition, a silicon source gas is flowed simultaneously with a germanium source gas. An anneal is then performed to roughen the silicon-germanium layer. In accordance with preferred parameters for the deposition and anneal, the layer takes on a hemispherical grained configuration. The preferred process advantageously lowers activation energy for the roughening anneal, while simultaneously providing improved conductivity.

DETAILED DESCRIPTION OF THE PREFERRED EMBODIMENT

The present invention provides an improved method for formation of hemispherical grained (HSG) silicon layers. While described in the context of a DRAM memory cell in a container configuration, those skilled in the art of integrated circuit fabrication may find application for the present invention for various memory cell configurations, and indeed in any other context in which high surface area conductive layers are desired.

Figure 1:
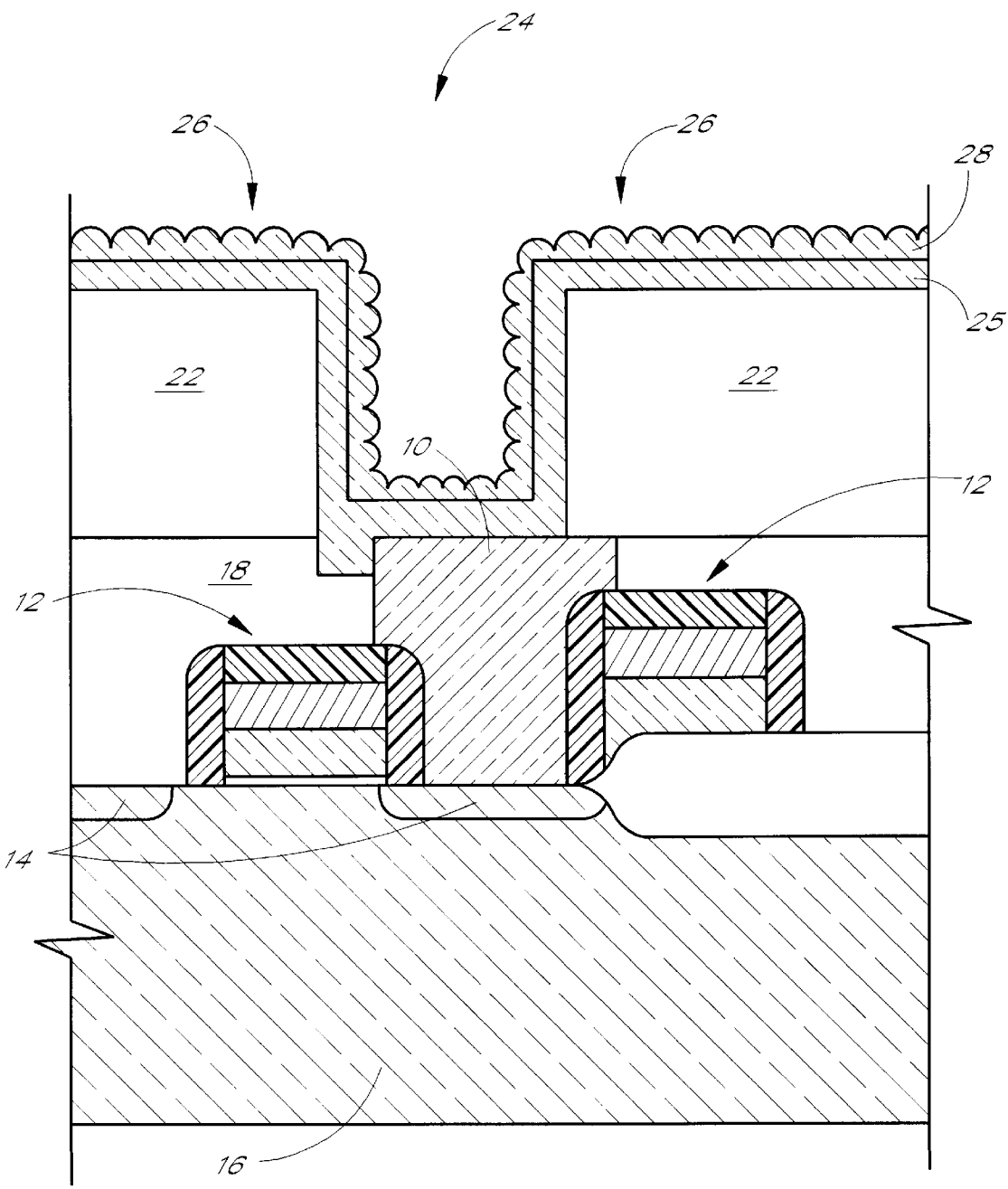
FIGS. 1–2 illustrate generally the fabrication of a bottom electrode conductive container having a rough silicon surface, as provided for in the prior art.
Figure 2:
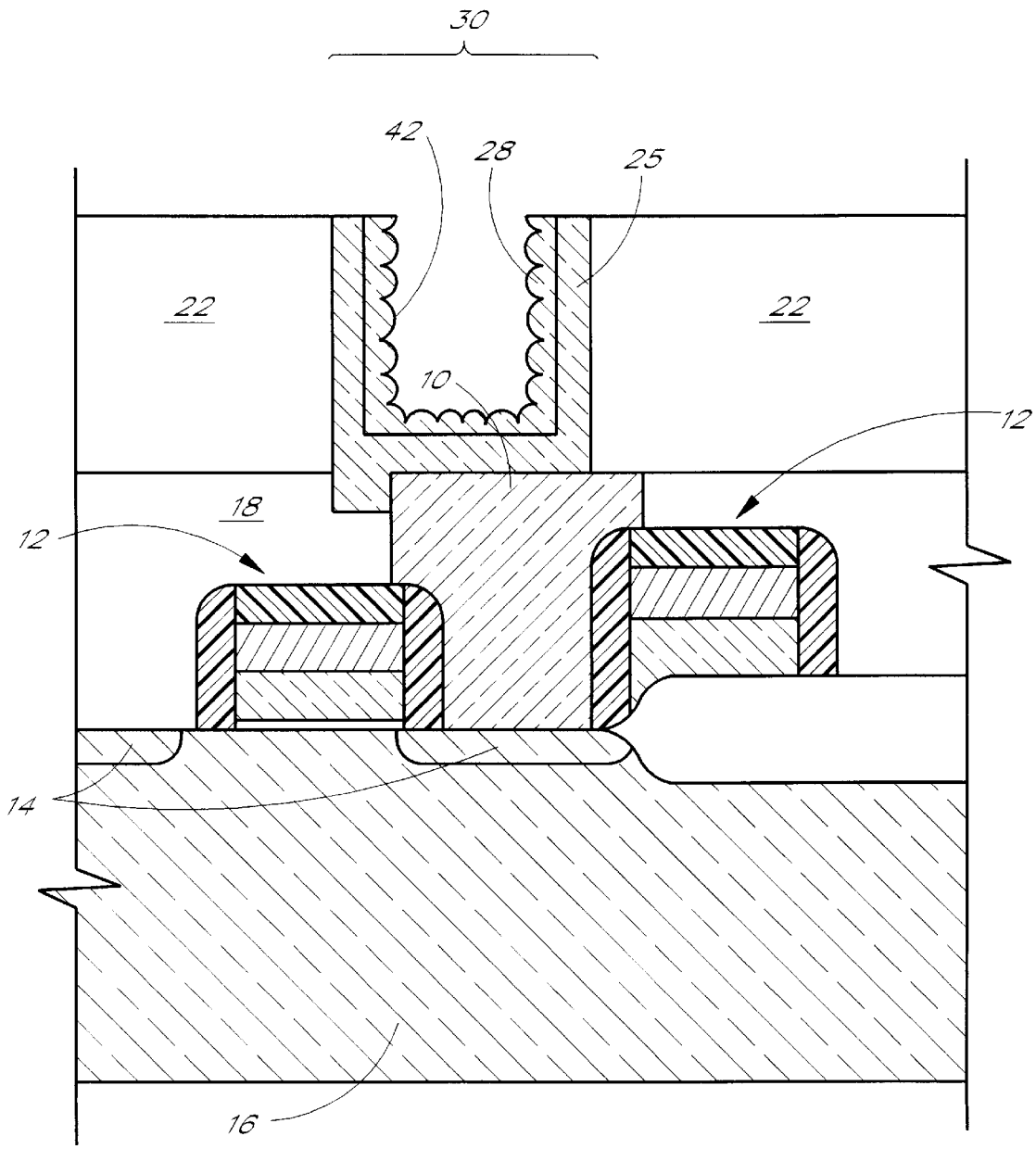

The preferred embodiment of the present invention is adapted to the fabrication process for constructing container electrodes discussed in the "Background" section above. A conductive substrate, such as conductive layer 25 of prior art FIG. 1, should be formed prior to formation of the rough layer, in accordance with the preferred embodiment. Such a substrate will serve to ensure mechanical support as well as electrical connection between grains of the rough layer to be formed. Additionally, in the preferred context of a DRAM memory cell, the substrate should form electrical connection to an underlying active area of a semiconductor wafer.

Figure 3:
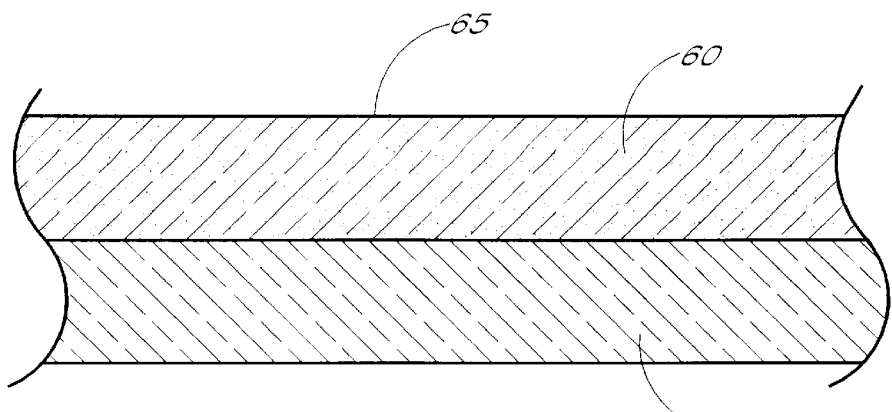
FIGS. 3–6 illustrate generally a method of fabricating a layer of rough silicon-germanium over a conductive substrate, in accordance with a preferred embodiment of the present invention.

FIG. 3 illustrates in isolation a substrate layer 50. The substrate 50 preferably comprises polysilicon, but may also comprise a polysilicon-germanium alloy formed in any known manner, including the chemical vapor deposition method described in more detail below. The preferred polysilicon substrate 50 should have a thickness between about 200 Å and 1,000 Å, and most preferably about 300 Å.

FIG. 3 also illustrates a silicon-germanium layer 60 overlying the substrate 50, the layer 60 preferably comprising amorphous silicon. In accordance with the preferred embodiment, the silicon-germanium layer 60 is doped with germanium atoms in order to facilitate the redistribution of silicon atoms in the vacuum anneal step to follow. The silicon-germanium 60 should have a thickness between about 100 Å and 1,000 Å, more preferably between about 200 Å and 700 Å and most preferably about 300 Å.

The germanium atoms may be implanted into a previously formed undoped amorphous silicon layer, as will be understood by those having skill in this art. More preferably, however, the silicon-germanium layer 60 is in-situ doped with germanium, that is, doped during the deposition process. U.S. Pat. No. 5,130,885, issue to Fazan et al. and assigned to the assignee of the present invention, discloses a chemical vapor deposition method of forming a silicon-germanium alloy. That method, however, involves conditions which optimize macroscopic islanding during the deposition.

The preferred embodiment of the present invention involves a surface seeding method of forming a rough surface from a silicon-germanium layer. Most preferably, the deposition comprises flowing about 20 to 100 sccm of silane as the silicon source gas, and about 0.1 to 20 sccm of $GeH_4$ or $Ge_2H_6$ as the germanium source gas in a low pressure chemical vapor deposition (LPCVD) process. This deposition should be conducted with reactor temperature in the range of between 100° C. and 800° C., more preferably between about 300° C. and 700° C., most preferably between about 400° C. and 600° C., while the chamber pressure is maintained between about 20 mTorr and 600 mTorr, more preferably between about 50 mTorr and 500 mTorr, most preferably about 190 mTorr.

With either implanted or in-situ doping, the germanium should represent a mole fraction of between about 0.05 and 0.75 of the amorphous silicon-germanium layer 60. More preferably, the germanium mole fraction is between about 0.20 and 0.40.

The Ge-doped amorphous silicon layer 60 is then subjected to a vacuum anneal. The structure is preferably heated to a temperature in the range of between 450° C. and 700° C., more preferably between about 530° C. and 580° C., and most preferably between about 550° C. and 570° C. Chamber pressure during the anneal should be maintained between about 80 mTorr and 300 mTorr. For redistribution of the preferred 500 Å silicon-germanium layer 60, the anneal should be maintained for between about 1 minute and 60 minutes, preferably less than about 30 minutes, more preferably less than about 15 minutes, particularly less than about 10 minutes, and most preferably less than about 5 minutes, depending in part upon the anneal temperature. It will be understood that different parameters may apply for different thicknesses of amorphous silicon and different germanium mole fractions. The surface migration of the silicon atoms to nucleation sites results in the formation of a rough or texturized, granular surface.

A seeding source gas may also be flowed during the anneal, to aid in formation of nucleation sites. Most preferably, a silicon source gas, a germanium source gas, or sources of both silicon and germanium are flowed during the anneal. Examples of such gases include those described above with respect to initial formation of the silicon-germanium layer 60 by CVD.

Figure 4:
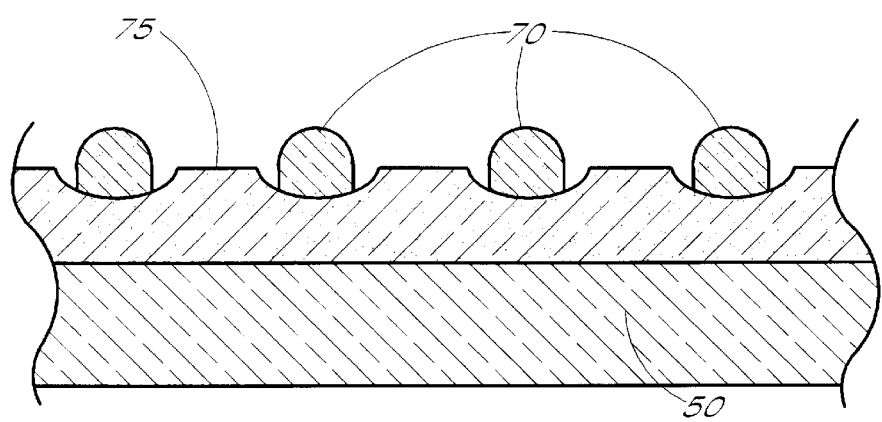
Figure 5:
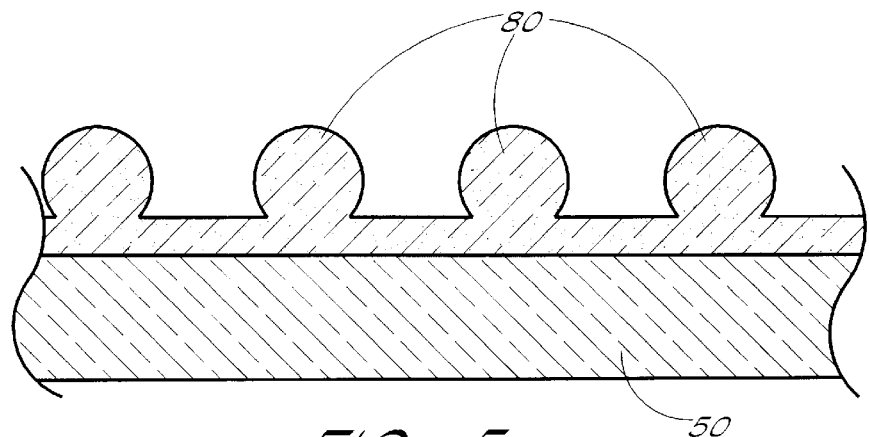

FIGS. 4 and 5 illustrate generally the results of the vacuum anneal. Initially, the anneal induces thermal nucleation, or microcrystal formation, at a surface 65 of the silicon-germanium layer 60. A seeding source gas, as described above, may also contribute to seeding, or initial nucleation. Thermal energy during the anneal causes migration of silicon atoms, and these atoms are captured at the surface 65 by the growing crystals. FIG. 4 illustrates a plurality of relatively small silicon crystal grains 70. As the anneal is continued, migrating silicon atoms continue to be captured at a continually recessing surface 75 by the crystal grains 70. Most preferably, the anneal may be continued until no amorphous silicon remains, leaving well separated grains 70 for a high electrode surface. The grains are mechanically supported and electrically connected by the underlying polysilicon substrate 50.

Hemispherical grains thus grow about these surface nucleation sites until the entire amorphous silicon layer 60 has been converted into crystallized silicon in the form of fully matured hemispherical "bumps" or grains 80, as illustrated in FIG. 5. The resultant grains 80 shown in FIG. 5 may range in height from 100 Å to 1,800 Å, depending upon the thickness of the original silicon-germanium layer 60 (FIG. 3). The height also depends, in part, upon the lateral distribution (spacing) of grains 80, which in turn depends upon nucleation conditions. As disclosed in "Novel seeding method for the growth of polycrystalline Si films with hemispherical grains," by Akira Sakai and Toru Tatsumi, Applied Physics Letters, Vol. 61, No. 2, Jul. 13, 1992, the distribution of nucleation sites may be controlled as well. "Bump height" for the preferred embodiment ranges between about 100 Å and 1,800 Å, more preferably between 300 Å and 1,000 Å, particularly greater than about 500 Å, and most preferably about 800 Å for the illustrated embodiment.

Incorporation of germanium has several advantages. The large germanium atoms tend to induce stress in the amorphous silicon of the layer 60, causing a greater mobility of the silicon atoms and speeding the process of HSG silicon formation. Greater silicon mobility not only results in greater throughput from shorter anneal time, but also enhances the redistribution of silicon atoms to permit greater bump height. Thicker layers of amorphous silicon and longer anneal time may result in even more enhanced HSG texture where desired, as will be understood by those of skill in the art.

Efficiencies are also achieved in a lowering of the activation energy required for promotion of crystallization. Comparing the preferred process to prior art vacuum anneals, it will be understood that the incorporation of germanium may produce a greater bump height for a given thickness of the initial silicon source layer or for a given energy input. A bump height of greater than about 300 Å and more preferably greater than 500 Å, for example, may be achieved with anneal times less than about 10 minutes, increasing throughput. Alternatively, comparable bump height may be achieved with anneal temperatures considerably lower than prior art vacuum anneals, namely under 700° C., more preferably under about 600° C. for longer anneal times, and most preferably under about 570° C.

Finally, use of the above-mentioned CVD process also enables use of in situ doping to enhance the conductivity of the HSG silicon grains 80 without interfering with the later redistribution of silicon atoms. Thus, a dopant gas, such as a source for phosphorus (e.g., $PH_3$, $P_2H_6$) or arsenic, is simply incorporated into the deposition process, such that no additional doping step is required. In essence, all of the advantages set forth above may be achieved by simply replacing a conventional post-anneal doping step with in situ doping, performed simultaneously with the incorporation of the germanium during the CVD. Thus, for example, the CVD process may comprise flowing $Ge_2H_6$, $SiH_4$, and $PH_3$ simultaneously.

Figure 6:
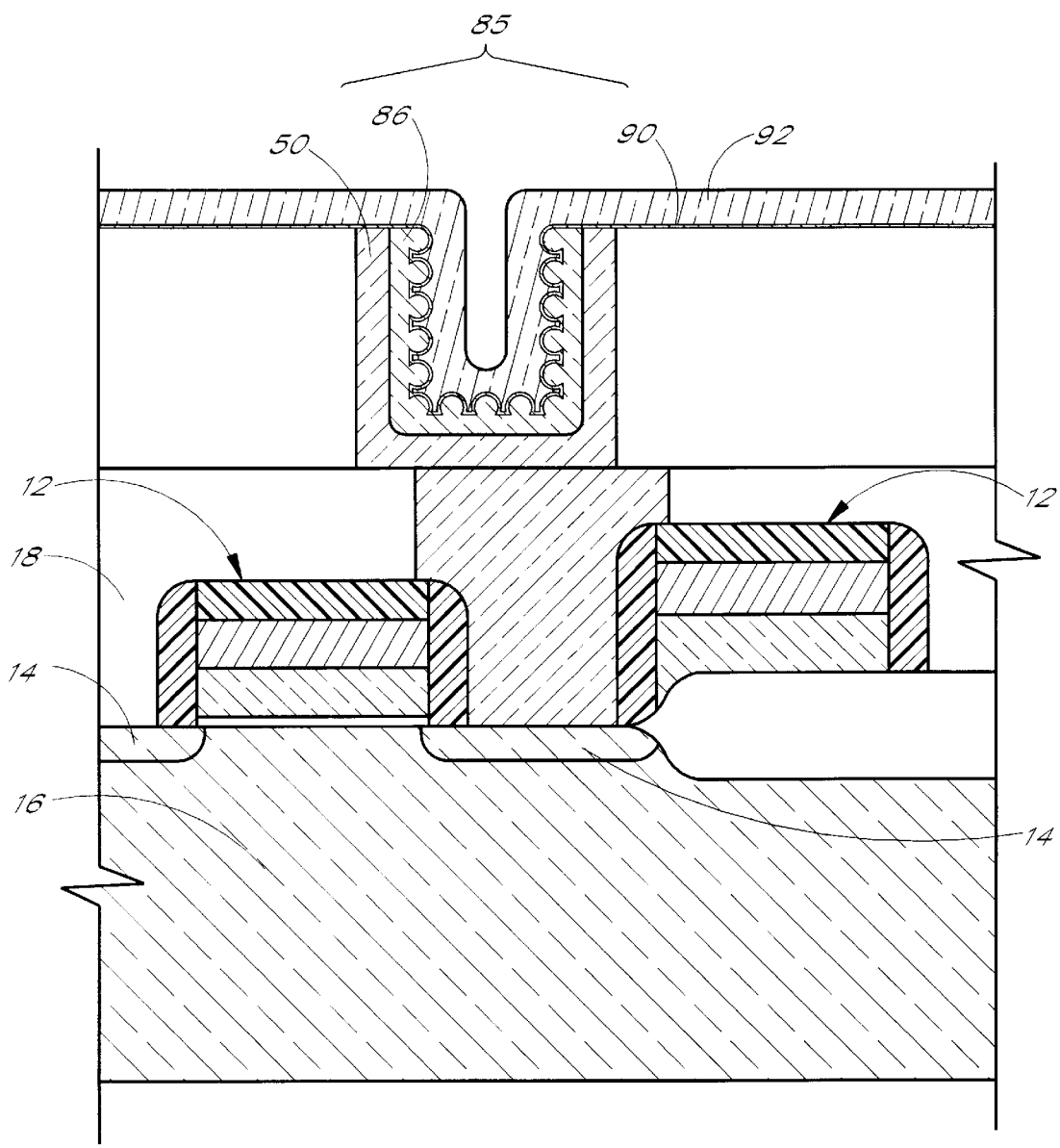

FIG. 6 illustrates a DRAM cell 85, the bottom electrode of which comprises a rough layer 86 created by the preferred process over a substrate 50. The electrode is isolated from other cells on a wafer, preferably by a planarization step. The cell 85 is completed by formation of a dielectric layer 90, which may comprise an oxide, nitride, ONO, or other insulating material, and a top electrode 92, preferably comprising a polysilicon layer.

The rough layer 86 comprises high-surface area grains or "bumps," as illustrated in FIG. 5. As mentioned, the rough silicon layer 86 has a preferred thickness between about 300 Å and 1,000 Å, most preferably about 800 Å. Together, the rough silicon 86 (with incorporated germanium) and preferred polysilicon (or polysilicon-germanium) substrate 50 (300 Å) produce a total bottom electrode wall thickness between about 300 Å and 2,000 Å, most preferably about 1,100 Å. While this total wall thickness is comparable to that of prior art electrodes incorporating rough silicon, the percentage of the wall thickness represented by the contours of the rough layer 68 is higher. Accordingly, the electrode surface area and capacitance of the cell 85 may be higher than that presented by the prior art. Alternatively, parameters may be adjusted to produce bump height similar to that of prior art processes.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

What is claimed is:

1. A process for forming a rough conductive layer, comprising:

forming a silicon-germanium layer over a surface in an integrated circuit; and annealing the silicon-germanium layer to form a roughened surface, the silicon-germanium layer forming at least a portion of an electrode.

2. The process of claim 1, wherein annealing the silicon-germanium layer comprises heating the silicon-germanium layer to a temperature of less than about 700° C.

3. The process of claim 2, wherein annealing the silicon-germanium layer further comprises flowing a seeding source gas.

4. The process of claim 1, wherein the rough conductive layer has a bump height of greater than about 300 Å.

5. The process of claim 1, wherein annealing the silicon-germanium layer comprises heating for a period of less than about 60 minutes.

6. The process of claim 1, wherein the surface comprises a surface of a polysilicon substrate for a DRAM storage node.

7. The process of claim 1, wherein the silicon-germanium layer is substantially amorphous as formed.

8. The process of claim 1, wherein forming the silicon-germanium layer comprises ion implanting the germanium into a silicon layer.

9. The process of claim 1, wherein forming the silicon-germanium layer comprises chemical vapor deposition of silicon and germanium substantially simultaneously.

10. The process of claim 9, wherein the chemical vapor deposition comprises flowing a silicon source gas comprising silane and a germanium source gas comprising germane.

11. The process of claim 1, wherein the silicon-germanium layer comprises a germanium:silicon mole fraction of at least about 0.05.

12. The process of claim 1, wherein the silicon-germanium layer comprises a germanium:silicon mole fraction of at most about 0.20.

13. A method for forming a rough conductive layer for an electrode in an integrated circuit, comprising:
   a chemical vapor deposition (CVD) of a silicon-germanium layer over a semiconductor substrate, the CVD comprising flowing a silicon source gas and a germanium source gas at between about 300° C. and 700° C. under a pressure between about 50 mTorr and 500 mTorr, the germanium mole fraction of the layer between about 0.05 and 0.75, the layer having a thickness between about 200 Å and 700 Å; and
   annealing the layer at a temperature between about 530° C. and 580° C., for less than about 30 minutes to form the rough conductive layer.

14. The process of claim 13, wherein the CVD further comprises flowing a dopant gas.

15. The process of claim 13, wherein anneal the layer comprises heating the layer while flowing a seeding gas.

16. The process of claim 15, wherein the germanium source gas comprises $Ge_2H_6$, the silicon source gas comprises $SiH_4$, and the dopant gas comprises $PH_3$.

17. A process for forming a rough and adequately conductive layer for an integrated circuit capacitor storage electrode, comprising:
   forming a conductively doped silicon-germanium layer, the layer including a germanium mole fraction of at least about 0.05; and
   annealing the silicon-germanium layer sufficiently to roughen the layer and form the capacitor electrode.

18. The process of claim 17, wherein forming the conductively doped silicon-germanium layer comprises a chemical vapor deposition, comprising:
   flowing a silicon source gas;
   flowing a germanium source gas; and
   flowing a dopant gas.

19. The process of claim 17, wherein the germanium mole fraction is at between 0.05 and 0.20.

20. A process for forming a rough and adequately conductive layer for a an integrated circuit electrode, comprising:
   a chemical vapor deposition of a conductive silicon-germanium layer over a semiconductor substrate, the deposition comprising flowing a silicon source gas, a germanium source gas, and a dopant gas; and
   annealing the silicon-germanium layer while flowing a seeding source gas.

21. The process of claim 20, wherein the seeding source gas comprises silicon.

22. The process of claim 21, wherein the seeding source gas further comprises germanium.

23. The process of claim 20, wherein the seeding source gas comprises germanium.

24. The process of claim 20, wherein the the silicon-germanium layer is electrically connected to an active area formed in the semiconductor substrate.

25. A process for forming a rough silicon-germanium layer having a bump height of greater than about 300 Å, comprising:
   forming a silicon-germanium layer; and
   annealing the silicon-germanium layer for less than about 15 minutes to roughen the silicon-germanium layer and form an electrode in an integrated circuit memory cell.

26. The process of claim 25, wherein the anneal is performed for less than about 5 minutes.

27. The process of claim 25, wherein the bump height is greater than about 500 Å.

28. A process for forming a rough silicon-germanium layer in an integrated circuit, the layer having a bump height of greater than about 300 Å, the process comprising:
   forming a silicon-germanium layer; and
   annealing the silicon-germanium layer at less than about 600° C. to roughen the silicon-germanium layer.

29. The process of claim 28, wherein annealing comprises heating the silicon-germanium layer while flowing a silicon source gas.

30. The process of claim 28, wherein the anneal is performed at less than about 570° C.

31. The process of claim 28, wherein the bump height is greater than about 500 Å.

32. A method of forming a conductively doped, rough silicon-germanium layer, comprising:
   forming a silicon layer on a partially fabricated integrated circuit;
   in situ doping the silicon layer with germanium to form a silicon-germanium layer; and
   redistributing the silicon-germanium layer to form the rough silicon-germanium layer for an integrated capacitor electrode.

* * * * *